United States Patent
Bae et al.

(10) Patent No.: US 7,956,530 B2
(45) Date of Patent: Jun. 7, 2011

(54) ORGANIC ELECTROLUMINESCENT DISPLAY DEVICE AND METHOD OF FABRICATING THE SAME

(75) Inventors: Sung-Joon Bae, Gyeonggi-do (KR); Jin-Ook Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/693,165

(22) Filed: Jan. 25, 2010

(65) Prior Publication Data

US 2010/0156286 A1    Jun. 24, 2010

Related U.S. Application Data

(63) Continuation of application No. 11/024,015, filed on Dec. 29, 2004, now Pat. No. 7,728,509.

(30) Foreign Application Priority Data

Dec. 30, 2003 (KR) .............................. 2003-0100668

(51) Int. Cl.
    *H05B 33/22* (2006.01)
(52) U.S. Cl. ........................................ 313/504; 313/509
(58) Field of Classification Search .......... 313/498–512; 315/169.3; 345/36, 45, 76
    See application file for complete search history.

(56) References Cited

U.S. PATENT DOCUMENTS

| | | | |
|---|---|---|---|
| 5,773,931 A * | 6/1998 | Shi et al. ................... | 313/509 |
| 6,037,712 A * | 3/2000 | Codama et al. ............. | 313/498 |
| 6,175,345 B1 | 1/2001 | Kuribayashi et al. | |
| 6,339,288 B1 * | 1/2002 | Qian et al. ................. | 313/498 |
| 6,548,961 B2 | 4/2003 | Barth et al. | |
| 7,199,516 B2 | 4/2007 | Seo et al. | |
| 2001/0026125 A1 | 10/2001 | Yamazaki et al. | |
| 2002/0060518 A1 * | 5/2002 | Duineveld et al. ......... | 313/506 |
| 2002/0158577 A1 | 10/2002 | Shimoda et al. | |
| 2004/0017162 A1 | 1/2004 | Sato et al. | |

FOREIGN PATENT DOCUMENTS

| | | |
|---|---|---|
| CN | 1434669 | 8/2003 |
| JP | 2001-177509 | 4/2001 |
| KR | 2002-0047889 | 6/2002 |
| KR | 2003-0017246 | 3/2003 |
| KR | 403291 | 10/2003 |
| KR | 2003-0086167 | 11/2003 |
| KR | 2004-0079476 | 9/2004 |
| WO | WO-02/078101 | 10/2002 |

OTHER PUBLICATIONS

Y.S. Kim et al. "Fabricating of Three-Dimensional Microstructures by Soft Modling." American Institute of Physics. vol. 79, No. 14, Oct. 2001, pp. 2285-2287.

* cited by examiner

*Primary Examiner* — Nimeshkumar D Patel
*Assistant Examiner* — Christopher M Raabe
(74) *Attorney, Agent, or Firm* — Morgan, Lewis & Bockius LLP

(57) ABSTRACT

An organic electroluminescent display device comprises a substrate, including a pixel region and a non-pixel region at a boundary of the pixel region; a first electrode on the substrate in the pixel region; a separator over the first electrode, the separator located in the non-pixel region, the separator including a first portion having a first width and a second portion having a second width smaller than the first width, the first portion overlapping edges of the first electrode, and the second portion within the non-pixel region; an organic electroluminescent layer over the separator in the pixel region surrounded by the separator; and a second electrode on an entire surface of the organic electroluminescent layer and the separator.

11 Claims, 15 Drawing Sheets

ORGANIC ELECTROLUMINESCENT DISPLAY DEVICE AND METHOD OF FABRICATING THE SAME

The present invention is a Continuation of U.S. patent application Ser. No. 11/024,015, filed Dec. 29, 2004, now U.S. Pat. No. 7,728,509 and claims priority to Korean Patent Application No. 2003-0100668, filed in Korea on Dec. 30, 2003, both of which are hereby incorporated by reference in their entirety.

BACKGROUND OF THE INVENTION

1. Field of the Invention The present invention relates to a display device, and more particularly, an organic electroluminescent display device and a method of fabricating the same.

2. Discussion of the Related Art

Generally, an organic electroluminescent display (OELD) device emits light by injecting electrons from a cathode and holes from an anode into an emission layer, combining the electrons with the holes, generating excitons, and transitioning the excitons from an excited state to a ground state. In contrast to a liquid crystal display (LCD) device, an OELD does not require an additional light source because the OELD device transmits light emitted by the transition of the excitons between states. Accordingly, the OELD device is lighter and smaller than a comparable liquid crystal display (LCD) device. The OELD device has other desirable characteristics, such as low power consumption, superior brightness and a fast response time. Because of these advantageous characteristics, the OELD device is regarded as a promising candidate for use in various next-generation consumer electronic applications, such as cellular phones, car navigation systems (CNS), personal digital assistants (PDA), camcorders and palmtop computers. Moreover, an OELD device is much cheaper to produce than an LCD device because the fabrication process is relatively simpler for the OELD device than the LCD device and has fewer processing steps. There are two different types of OELD devices: passive matrix and active matrix.

FIG. 1 is a cross-sectional view of an organic electroluminescent device according to a related art. Referring to FIG. 1, an OELD device 10 includes a first substrate 12 and a second substrate 28 facing and spaced apart from each other. An array element layer 14 is formed on an inner surface of the first substrate 12. The array element layer 14 includes including a thin film transistor (TFT) T. A first electrode 46, an organic electroluminescent (EL) layer 50, and a second electrode 52 are sequentially formed over the array element layer 14. The organic EL layer 50 may separately display red, green, and blue colors for each pixel region P.

The first substrate 12 and the second substrate 28 are attached with a sealant 26. The OELD device 10 is encapsulated by attaching the first substrate 12 to the second substrate 28. A moisture absorbent desiccant 22 is positioned on the second substrate 28. The moisture absorbent desiccant 22 eliminates moisture and oxygen that may penetrate the encapsulated organic EL layer 50. More particularly, a portion of the second substrate 28 is etched and the moisture absorbent desiccant 22 is placed in the etched portion and affixed by a holding element 25. Although not shown, the organic EL layer may be divided into a plurality of pixel regions by a separator.

FIG. 2 is a plan view of a separator in an organic electroluminescent device according to the related art. Referring to FIG. 2, a first electrode 46 and an organic EL layer 50 (shown in FIG. 1) are located in the pixel region P. A second electrode 52 (shown in FIG. 1) is formed on an entire surface of the first substrate 12. For example, when the first electrode 46 acts as an anode, it is formed by depositing and patterning a conductive material having a high work-function, such as indium tin oxide (ITO), through a vacuum apparatus, such as a sputtering chamber. In addition, when the organic EL layer 50 is made of a polymeric material, it is formed by a printing process, for example ink-jet printing. On the other hand, when the organic EL layer 50 is made of a monomeric material, it is formed by a deposition process.

A separator SP is required to divide the organic EL layer 50 into a plurality of pixel regions P in an independent emitting type OELD device using a polymeric organic EL material. The separator SP can prevent mixing between different colors of the organic EL layers 50. Although not shown, the buffer layer 48 and the separator SP correspond to portions of the gate, data and power lines.

The organic EL layer 50 includes red, green and blue EL layers (not shown) formed in the pixel regions P in repeating order after forming the separator SP at a boundary of the pixel regions P and a buffer layer 48 on the separator SP. The buffer layer 48 is located at the boundary of the pixel regions P including a portion overlapping edges of the first electrode 46 to prevent any electrical contact between the first electrode 46 and the second electrode 52 (shown in FIG. 1) at the corner of the separator SP. Thus, the buffer layer 48 is larger than the separator SP.

FIG. 3 is a plan view of an array substrate of an organic electroluminescent device for one pixel region according to the related art. In general, an array element layer 14 (shown in FIG. 1) of an OELD device 10 includes a switching thin film transistor $T_S$, a driving thin film transistor $T_D$ and a storage capacitor $C_{ST}$. A first substrate 12 is made of a transparent insulating substrate, such as glass and plastic. A gate line GL and a data line DL cross each other are formed on the first substrate 12. The gate line GL and the data line DL define a pixel region. An insulating layer (not shown) is interposed between the gate line GL and the data line DL. A power line PL crosses the gate line GL, in parallel with and spaced apart from the data line DL.

The switching thin film transistor $T_S$ includes a switching gate electrode 26, a switching active layer 16, a switching source electrode 34, and a switching drain electrode 36. Similarly, the driving thin film transistor $T_D$ includes a driving gate electrode 28, a driving active layer 18, a driving source electrode 38, and a driving drain electrode 40. The switching gate electrode 26 is connected to the gate line GL and the switching source electrode 34 is connected to the data line DL. The switching drain electrode 36 is connected to the driving gate electrode 28 via a first contact hole 69 that exposes a portion of the driving gate electrode 28. The driving source electrode 38 is connected to the power line PL via a second contact hole 57 that exposes a portion of the power line PL. Moreover, a first electrode 46 is connected to the driving drain electrode 40 via the third contact hole 59. The power line PL overlaps a first capacitor electrode 20 with the insulating layer interposed therebetween to form the storage capacitor $C_{ST}$.

Although not shown, the separator SP (shown in FIG. 2), which is formed in a portion corresponding to the data line DL and the power line PL, can divide the organic EL layer emitting a specific light into a plurality of pixel regions. Further, the buffer layer 48 (shown in FIG. 2) is formed between the first electrode 46 and the separator SP and is located in the non-pixel region at a boundary of the pixel region P including the portion overlapping edges of the first electrode 46.

FIGS. 4A, 4B and 5 are cross-sectional views taken along lines IVA-IVA, IVB-IVB and V-V of FIG. 3, respectively. Referring to FIGS. 4A, 4B and 5, a switching thin film transistor $T_S$ and a driving thin film transistor $T_D$ are formed on a first substrate 12 including a switching region S and a driving region D within a pixel region P, respectively. The switching thin film transistor $T_S$ includes a switching active layer 16, a switching gate electrode 26, a switching source electrode 34, and a switching drain electrode 36. Similarly, the driving thin film transistor $T_D$ includes a driving active layer 18, a driving gate electrode 28, a driving source electrode 38, and a driving drain electrode 40.

Specifically, although not shown, the switching gate electrode 26 is connected to the gate line GL and the switching source electrode 34 is connected to the data line DL. The switching drain electrode 36 is connected to the driving gate electrode 28. The driving source electrode 38 is connected to the power line PL, and the driving drain electrode 40 is connected to a first electrode 46 in the pixel region P. A buffer layer 48 is formed on the first electrode 46 at a boundary of the pixel region P corresponding to the data line DL and the power line PL, as shown in FIG. 5. The buffer layer 48 overlaps edges of the first electrode 46. A separator SP is formed on the buffer layer 48 within the boundary of the pixel region P. An organic EL layer 50 is formed on the first electrode 46 in the pixel region P surrounded by the separator SP. A second electrode 52 is formed on the entire surface of the organic EL layer 50 and the separator SP. However, at least two mask processes are required to form the buffer layer 48 and the separator SP for the OELD device.

FIGS. 6A to 6E are cross-sectional views of a fabricating process of an organic electroluminescent diode substrate for an organic electroluminescent device according to the related art. Referring to FIG. 6A, a first electrode 46 is formed on a first substrate 12 including a pixel region P. The first electrode 46 is located in the pixel region P. An inorganic material layer 47 is formed by depositing an inorganic material, such as silicon nitride (SiNx), on the entire surface of the first electrode 46 and the first substrate 12. A photoresist layer 80 is formed by coating photoresist on the inorganic insulating material layer 47.

Referring to FIG. 6B, a photoresist pattern 82 is formed by patterning the photoresist layer 80 on the inorganic material layer 47 at the boundary of the pixel region P including a portion overlapping edges of the first electrode 46. Referring to FIG. 6C, a buffer layer 48 is formed by etching a portion of the inorganic material layer 47 (shown in FIG. 6B) uncovered by the photoresist pattern 82 (shown in FIG. 6B). Then, the buffer layer 48 is formed using a first mask process, which includes exposing, developing and etching. An organic layer 90 is formed by coating an organic insulating material on the entire surface of the buffer layer 48 and the first electrode 46.

Referring to FIG. 6D, a separator SP is formed by patterning the organic material layer 90 (shown in FIG. 6C) through a second mask process similar to the first mask process. The separator SP is located within the boundary of the pixel region P but the buffer layer 48 overlaps the edges of neighboring pixel regions P to prevent the first electrode 46 and a second electrode that will be formed later from electrically contacting each other. Thus, although not shown, a width of the buffer layer 48 is larger than a width of the separator SP. When an organic EL layer is formed by coating a polymeric material, the separator SP should have a height of more than 1 micrometer. Thus, a portion of the organic EL layer near to the separator SP becomes thicker. Accordingly, the separator SP should have a predetermined side gap K with the buffer layer 48 toward the first electrode 46.

Referring to FIG. 6E, an organic EL layer 50 is formed on the first electrode 46 in the pixel region P surrounded by the separator SP. A second electrode 52 is formed on the entire surface of the organic EL layer 50 and the separator SP. The second electrode 52 acts as a cathode and comprises a metallic material having a low work-function, such as calcium (Ca), aluminum (Al) and magnesium (Mg) and lithium fluorine/aluminum (LiF/Al). In addition, when the organic EL layer 50 is formed by coating, no mask process is required for forming the organic EL layer 50.

At least two mask processes are required to form the buffer layer 48 and the separator SP. As a result, several mask processes are required for the entire manufacturing process. The defective fraction increases with the number of mask processes. Moreover, production yield decreases and production cost increases because of processing delay, thus weakening a competitive pricing of the EL device.

SUMMARY OF THE INVENTION

Accordingly, the present invention is directed to an OELD device and a method of fabricating the same that substantially obviate one or more of the problems due to limitations and disadvantages of the related art.

An object of the present invention is to provide an OELD device that can reduce fabrication processing time and cost.

Another object of the present invention is to provide a method of fabricating an OELD device that can reduce fabrication processing time and cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an organic electroluminescent display device comprises forming a first electrode in a pixel region of a substrate, the substrate including a non-pixel region at a boundary of the pixel region; forming a resin solution layer by coating a resin solution on the first electrode; pressing a mold on the resin solution layer, the mold having a recessed portion alternating with a protruding portion, the recessed portion having the same height as the protruding portion, the recessed portion and the protruding portion facing the resin solution layer, a first width of the recessed portion near to the resin solution layer being larger than a second width of the recessed portion away from the resin solution layer; solidifying the resin solution layer by heating; removing the mold from the solidified resin solution layer forming a separator in the non-pixel region on the substrate, the separator having a first portion having the first width and a second portion having the second width, the first portion overlapping edges of the first electrode, and the second portion within the non-pixel region; forming an organic electroluminescent layer on the first electrode in the pixel region surrounded by the separator; and forming a second electrode on the organic electroluminescent layer and the separator.

In another aspect, a method of fabricating an organic electroluminescent display device comprises forming a first electrode in a pixel region of a substrate, the substrate including a non-pixel region at a boundary of the pixel region; forming a resin solution layer by coating a resin solution on the first electrode; pressing a mold on the resin solution layer, the mold having a recessed portion alternating with a protruding portion, the recessed portion having the same height as the protruding portion, the recessed portion and the protruding portion facing the resin solution layer, the recessed portion and the protruding portion having respective square shapes; solidifying the resin solution layer by sequentially heating at two different temperatures including a first temperature smaller or equal to a boiling point of the resin solution and a second temperature higher than the first temperature; removing the mold from the solidified resin solution layer forming a separator in the non-pixel region on the substrate, the separator having a first portion having a first width and a second portion having a second width smaller than the first width, the first portion overlapping edges of the first electrode, and the second portion within the non-pixel region; forming an organic electroluminescent layer in the pixel region surrounded by the separator; and forming a second electrode on the organic electroluminescent layer and the separator.

In another aspect, a method of fabricating an organic electroluminescent device comprises forming a first electrode on the entire surface of a first substrate including a pixel region and a non-pixel region at a boundary of the pixel region; form a resin solution layer by coating a resin solution on the entire surface of the first electrode; pressing a mold on the resin solution layer under a predetermined pressure, the mold including a recessed portion alternating with a protruding portion, the recessed portion having the same height as the protruding portion, the recessed portion and the protruding portion of the mold facing the resin solution layer, a width of the recessed portion gradually increasing toward the substrate and a width of the protruding portion gradually decreasing toward the substrate; solidifying the resin solution layer by heating; removing the mold from the solidified resin solution layer forming a separator in the non-pixel region on the substrate, the separator having a first portion having a first width and a second portion having a second width smaller than the first width, the first portion closer to the substrate than the second portion, across-sectional of the second portion decreasing gradually from both end sides thereof toward a middle part thereof; and sequentially forming an organic electroluminescent layer and a second electrode on the first electrode, the organic electroluminescent layer and the second electrode divided into a region corresponding to the pixel region by the separator.

In another aspect, an organic electroluminescent display device comprises a substrate, including a pixel region and a non-pixel region at a boundary of the pixel region; a first electrode on the substrate in the pixel region; a separator over the first electrode, the separator located in the non-pixel region, the separator including a first portion having a first width and a second portion having a second width smaller than the first width, the first portion overlapping edges of the first electrode, and the second portion within the non-pixel region; an organic electroluminescent layer over the separator in the pixel region surrounded by the separator; and a second electrode on the entire surface of the organic electroluminescent layer and the separator.

In another aspect, an organic electroluminescent display device comprises a first substrate, including a pixel region and a non-pixel region at a boundary of the pixel region; a first electrode on the entire surface of the first substrate; a separator over the first electrode in the non-pixel region, the separator having a first portion having a first width and a second portion having a second width smaller than the first width, a cross-sectional of the second portion decreasing gradually from both end sides thereof toward a middle part thereof; an organic electroluminescent layer over the separator, the organic electroluminescent layer in the pixel region; and a second electrode on the organic electroluminescent layer, the second electrode corresponding to the organic electroluminescent layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
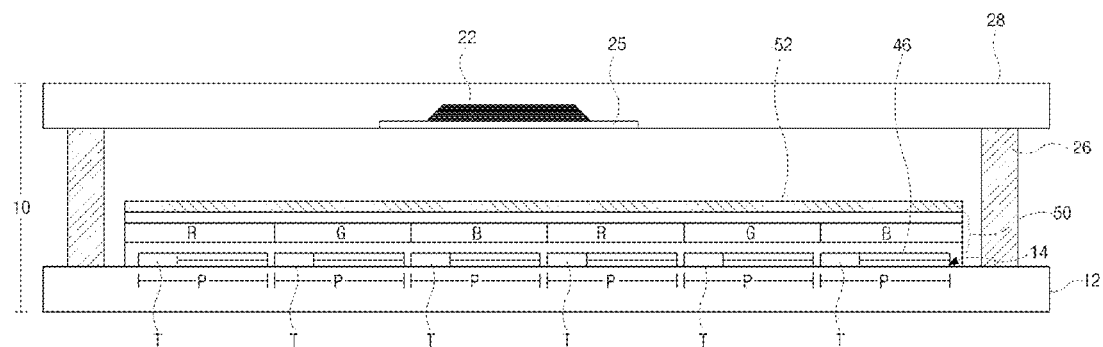
FIG. 1 is a cross-sectional view of an organic electroluminescent device according to a related art.
Figure 2:
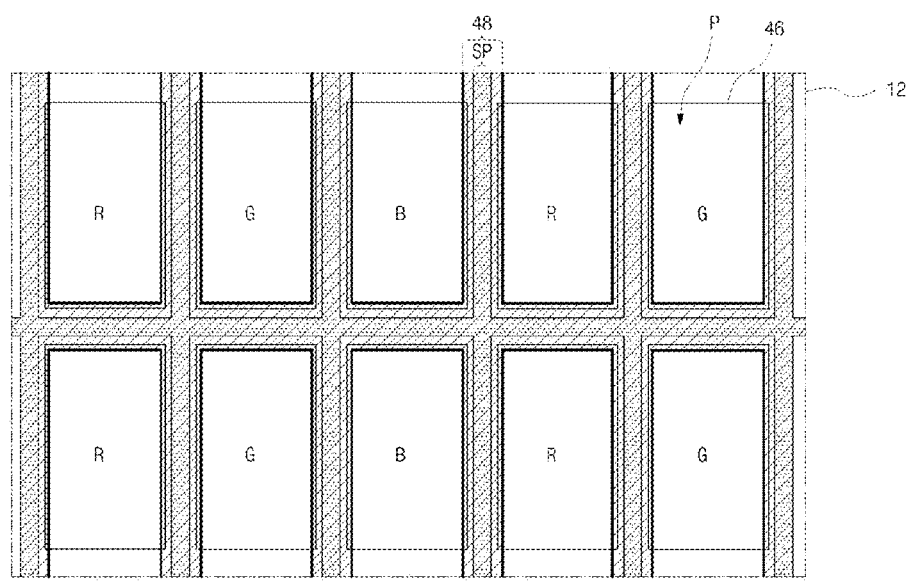
FIG. 2 is a plan view of a separator in an organic electroluminescent device according to the related art.
Figure 3:
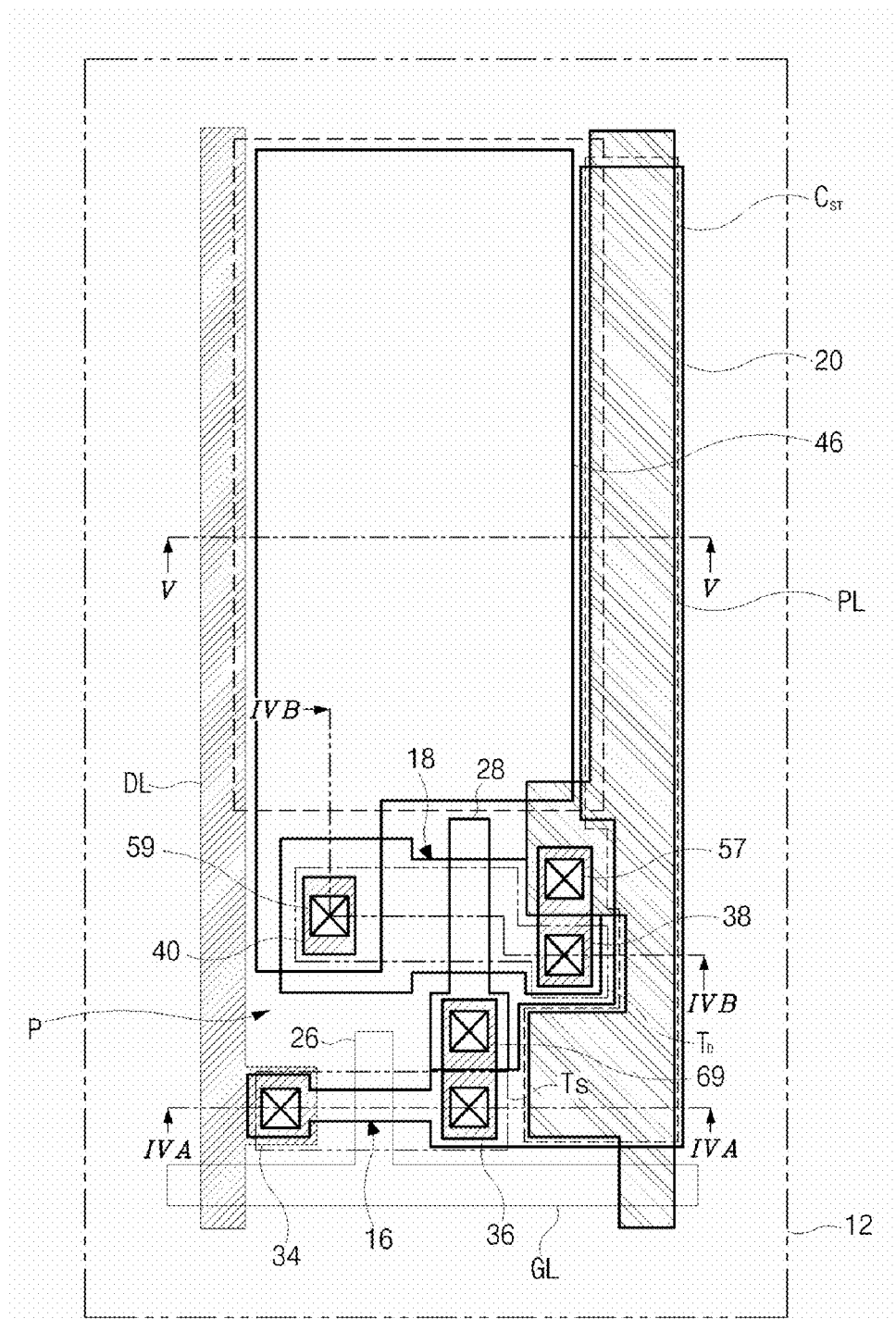
FIG. 3 is a plan view of an array substrate of an organic electroluminescent device for one pixel region according to the related art.
Figure 4A:
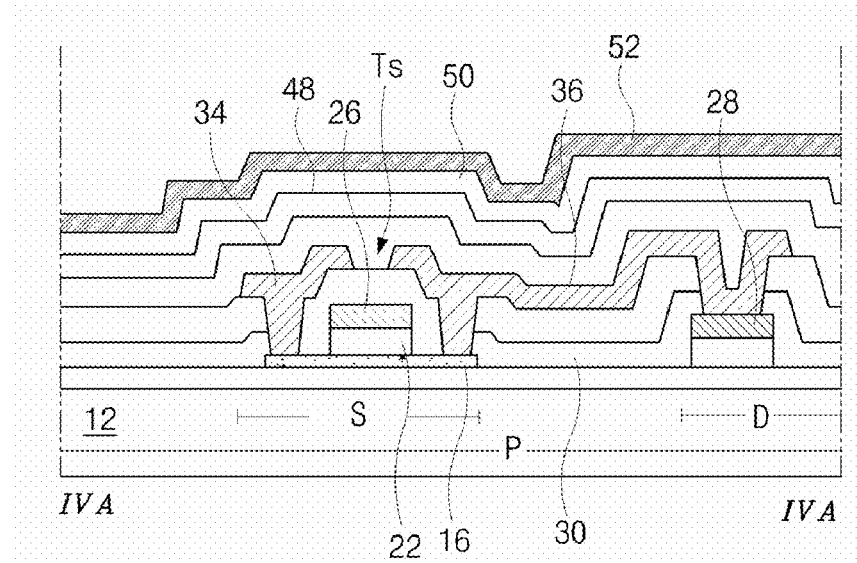
FIGS. 4A, 4B and 5 are cross-sectional views taken along lines IVA-IVA, IVB-IVB and V-V of FIG. 3, respectively.
Figure 4B:
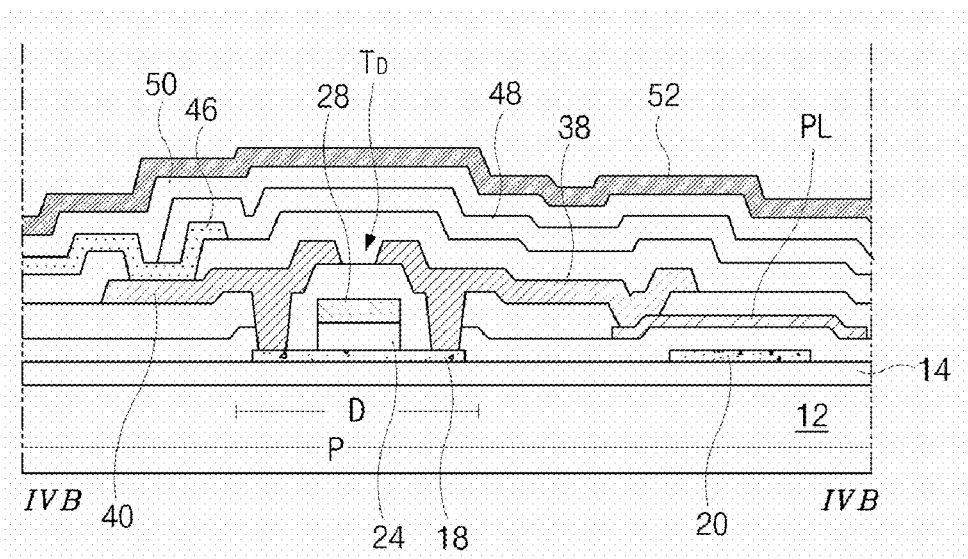
Figure 5:
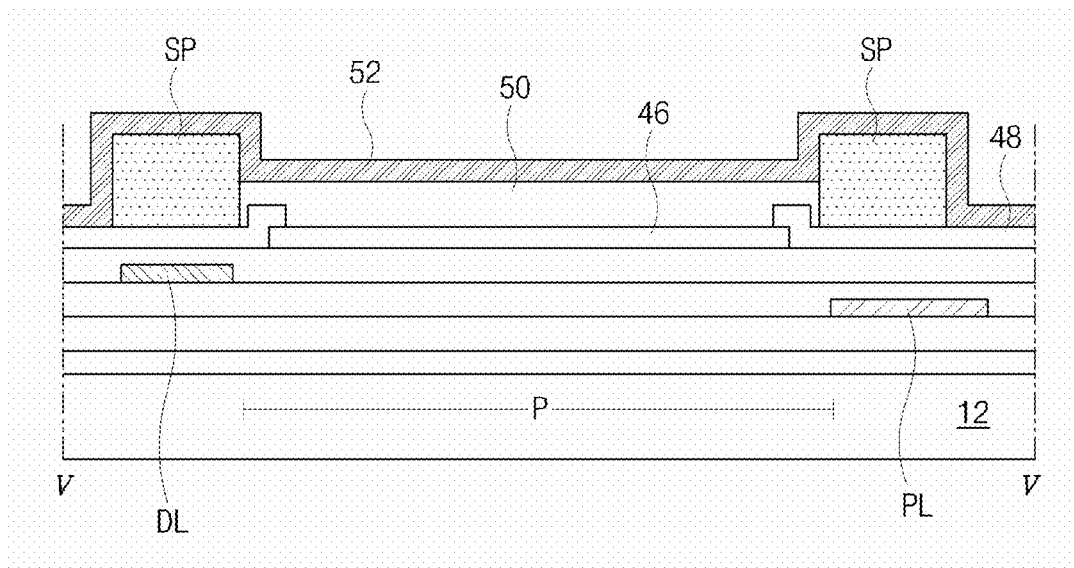
Figure 6A:
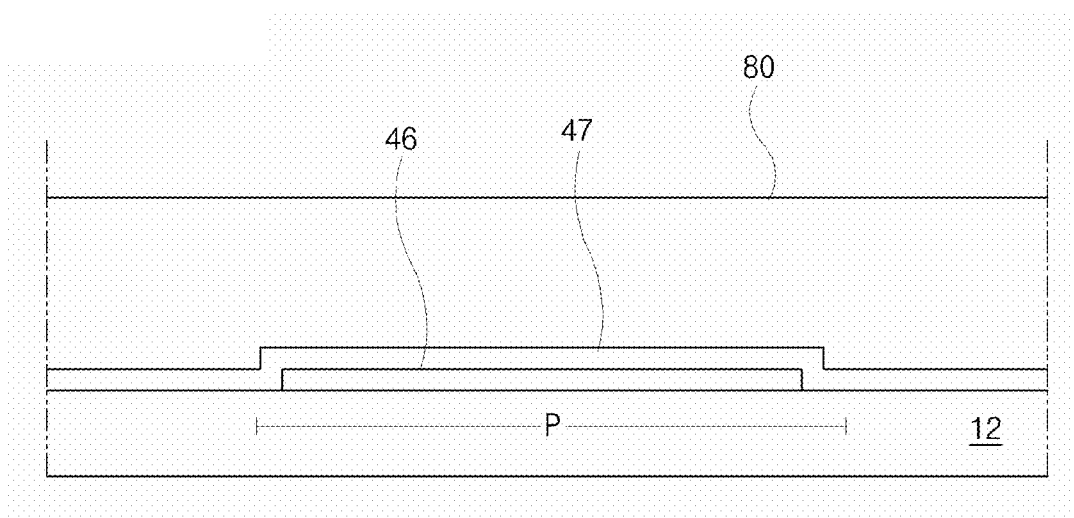
FIGS. 6A to 6E are cross-sectional views of a fabricating process of an organic electroluminescent diode substrate for an organic electroluminescent device according to the related art.
Figure 6B:
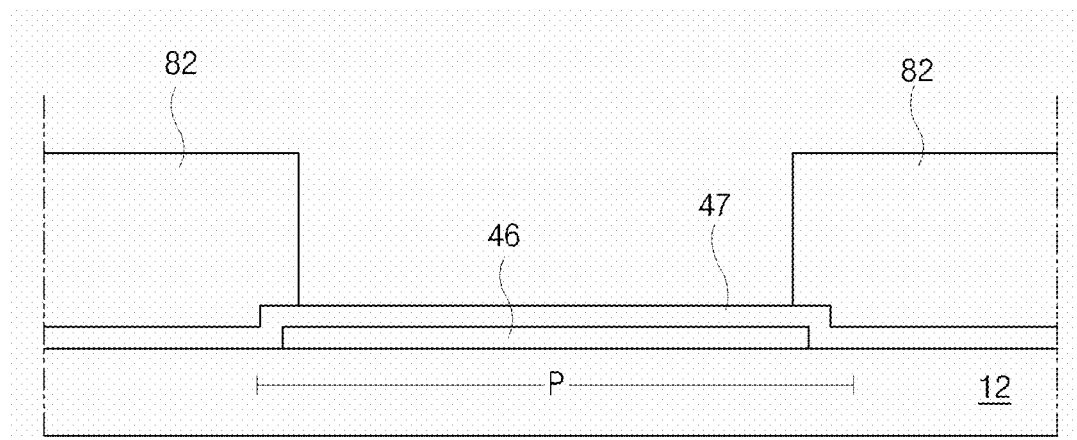
Figure 6C:
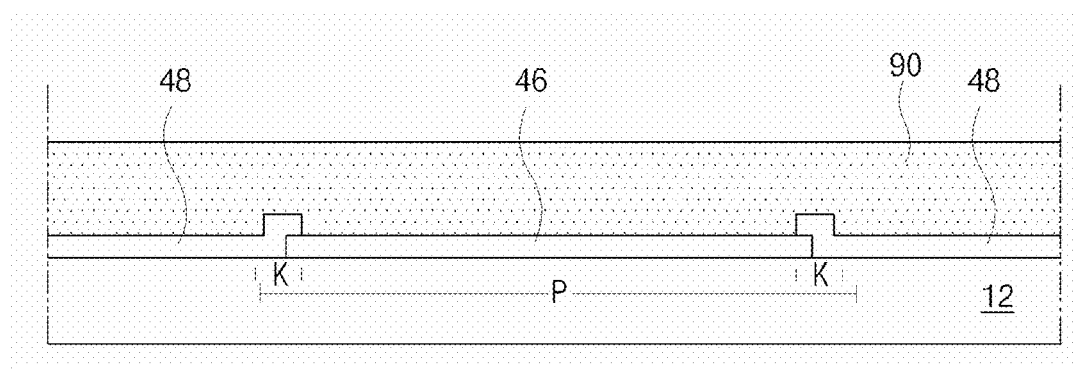
Figure 6D:
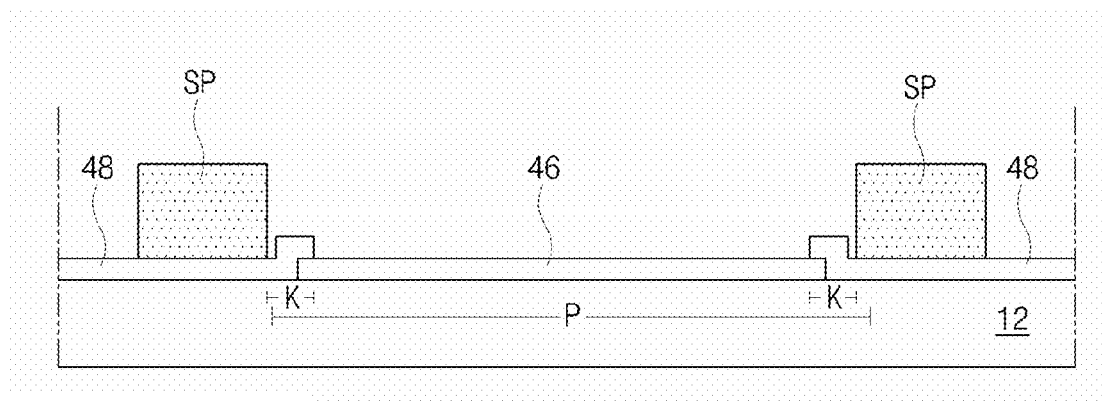
Figure 6E:
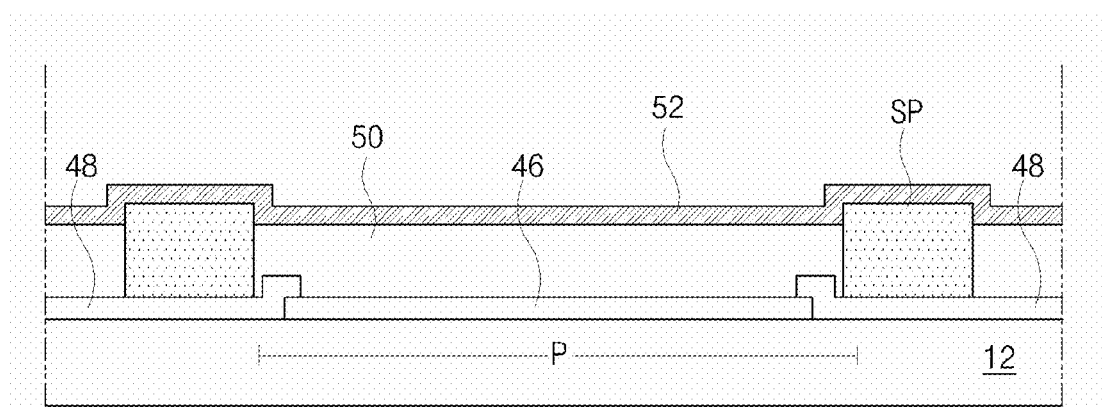
Figure 7A:
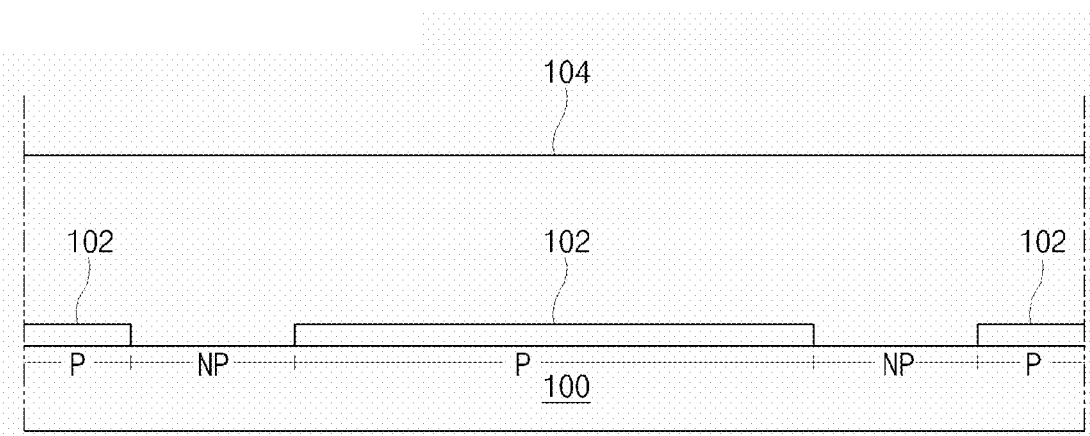
FIG. 7A is a cross-sectional view of the formation of a pixel electrode on a substrate in a process of fabricating an organic electroluminescent device according to a first embodiment of the present invention.

FIG. 7A is a cross-sectional view of the formation of a pixel electrode on a substrate in a process of fabricating an organic electroluminescent device according to a first embodiment of the present invention. Referring to FIG. 7A, a substrate 100 includes a pixel region P, and a non-pixel region NP at a boundary of the pixel region P. A first electrode 102 is formed on the substrate 100. The first electrode 102 is located in the pixel region P. For example, when the first electrode 102 acts as an anode, it is made of a conductive material having a high work-function, such as indium tin oxide (ITO). Then, a resin solution layer 104 is formed on the entire surface of the substrate 100 including the first electrode 102 by coating the entire surface of the substrate 100 and the first electrode 102 with a resin solution. The coating process may be performed by dipping the substrate in the resin solution. Alternatively, the coating process may be performed by dropping the resin solution on the substrate. The resin solution may include a transparent organic material, such as acrylic resin.

Figure 7B:
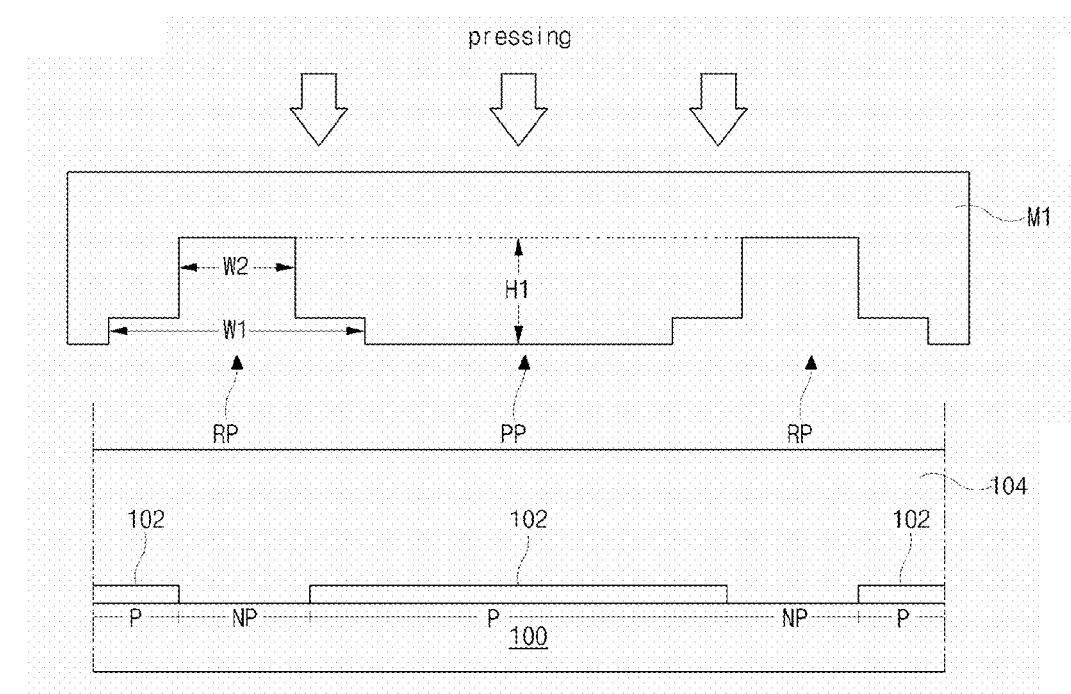
FIG. 7B is a cross-sectional view of the molding of a resin layer on a substrate in a process of fabricating an organic electroluminescent device according to the first embodiment of the present invention.

FIG. 7B is a cross-sectional view of the molding of a resin layer on a substrate in a process of fabricating an organic electroluminescent device according to the first embodiment of the present invention. Referring to FIG. 7B, a mold M1 is prepared. The mold M1 has a recessed portion RP alternating with a protruding portion PP. The recessed portion RP has the same height H1 as the protruding portion PP. The mold M1 is slightly pressed on the resin solution layer 104, with the recessed portion RP and the protruding portion PP of the mold M1 facing the resin solution layer 104. The recessed portion RP has a first portion having a first width W1 and a second portion having a second width W2. The first portion is closer to the resin solution layer 104 than the second portion. The second width W2 is smaller than the first width W1. A portion of the resin solution layer 104 corresponding to the recessed portion RP of the mold M1 become a separator at a later stage in the manufacturing process.

In an embodiment of the invention, recessed and protruding patterns for the mold M1 may be formed using a soft molding method. In this case, the mold M1 is formed by filling an elastomeric in a predetermined mold frame. For example, the elastomeric includes one of polydimethylsiloxane (PDMS), polyurethane and polyimide.

When the mold M1 is slightly pressed against the resin solution layer 104, a portion of the resin solution layer 104 contacting the protruding portion PP of the mold M1 is moved toward the recessed portion RP due to a repulsion between the mold M1 and the resin solution layer 104. Thus, the portion of the resin solution layer 104 contacting the protruding portion PP of the mold M1 fills the inner part of the recessed portion RP of the mold M1. Then, the resin solution layer 104 is solidified by heating it. Heating may be performed at a temperature higher than a boiling point and a transition temperature of the resin solution.

Figure 7C:
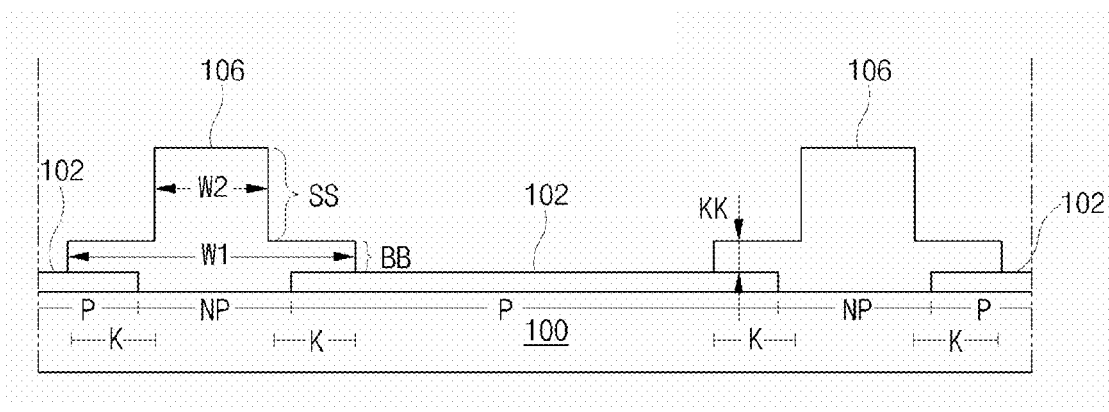
FIG. 7C is a cross-sectional view of the formation of a separator on a substrate in a process of fabricating an organic electroluminescent device according to the first embodiment of the present invention.

FIG. 7C is a cross-sectional view of the formation of a separator on a substrate in a process of fabricating an organic electroluminescent device according to the first embodiment of the present invention. Referring to FIG. 7C, the mold M1 (shown in FIG. 7B) is removed, leaving the solidified molded resin solution layer on the substrate 100. The solidified molded resin solution layer forms a separator 106 on the substrate 100. The separator 106 has a first portion BB having the first width W1 and a second portion SS having the second width W2. The first portion BB of the separator 106 overlaps edges of the first electrode 102. The second portion SS of the separator 106 is located within the non-pixel region P. The first portion BB acts as a buffer layer and the second portion SS acts as a substantial separator means.

The first width W1 of the first portion BB is larger than the second width W2 of the second portion SS. A side gap K between the first width W1 and the second width W2 is between 2 micrometers and 10 micrometers, a thickness KK of the first portion BB of the separator 106 is less than about 300 nanometers. A side of the second portion SS is perpendicular to a surface of the substrate 100.

Figure 7D:
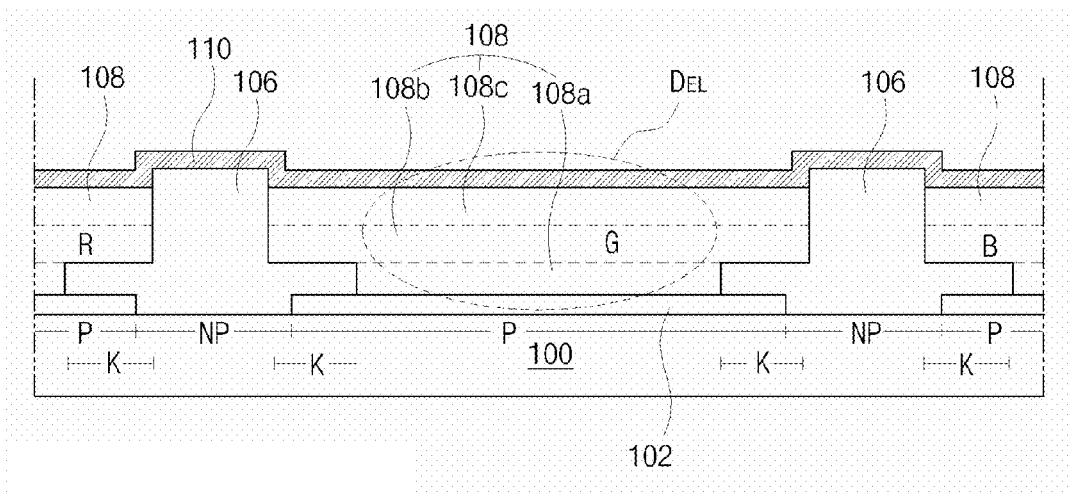
FIG. 7D is a cross-sectional view of the formation of an organic electroluminescent layer on a substrate in a process of fabricating an organic electroluminescent device according to the first embodiment of the present invention.

FIG. 7D is a cross-sectional view of the formation of an organic electroluminescent layer on a substrate in a process of fabricating an organic electroluminescent device according to the first embodiment of the present invention. Referring to FIG. 7D, at least one organic electroluminescent (EL) layer 108 is formed on the first electrode 102 in the pixel region P surrounded by the separator 106. Forming the organic EL layer 108 includes forming red, green and blue EL layers (not shown) in the pixel regions P in repeating orders. The at least one organic EL layer 108 may be a single layer or may include multiple layers. When the at least one organic EL layer 108 includes multiple layers and the first electrode 102 acts as the anode, the at least one organic EL layer 108 includes a hole transporting layer 108a on the first electrode 102, an emitting layer 108b and an electron transporting layer 108c on a later-formed second electrode.

A second electrode 110 is formed on the entire surface of the organic EL layer 108 and the separator 106. When the second electrode 110 acts as a cathode, it includes a metallic material, such as calcium (Ca), aluminum (Al) and magnesium (Mg) and lithium fluorine/aluminum (LiF/Al). The first electrode 102, the organic EL layer 108 and the second electrode 110 form an organic EL diode $D_{EL}$.

Figure 8A:
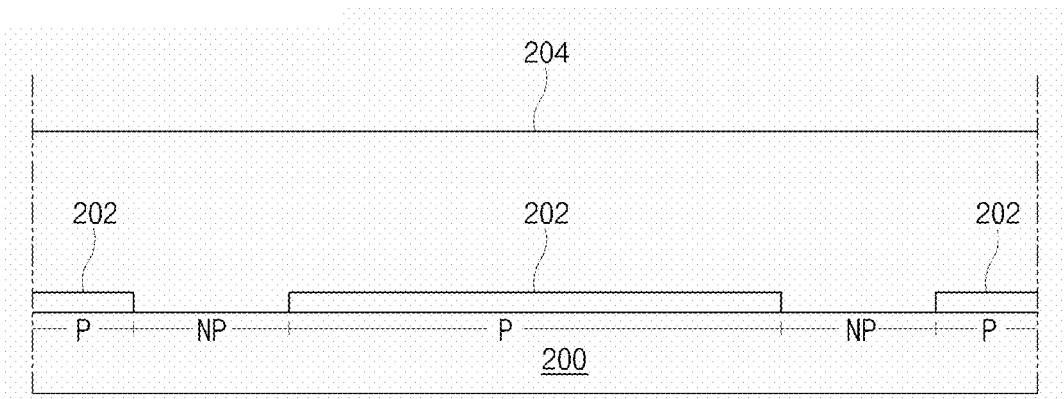
FIG. 8A is a cross-sectional view of the formation of a pixel electrode on a substrate in a process of fabricating an organic electroluminescent device according to a second embodiment of the present invention.

FIG. 8A is a cross-sectional view of the formation of a pixel electrode on a substrate in a process of fabricating an organic electroluminescent device according to a second embodiment of the present invention. Referring to FIG. 8A, a substrate 200 includes a pixel region P, and anon-pixel region NP at a boundary of the pixel region P. A first electrode 202 is formed on the substrate 200. The first electrode 202 is located in the pixel region P. Then, a resin solution is coated on the entire surface of the substrate 200 including the first electrode 202 to form a resin solution layer 204. The resin solution may include a transparent organic material, such as acrylic resin.

Figure 8B:
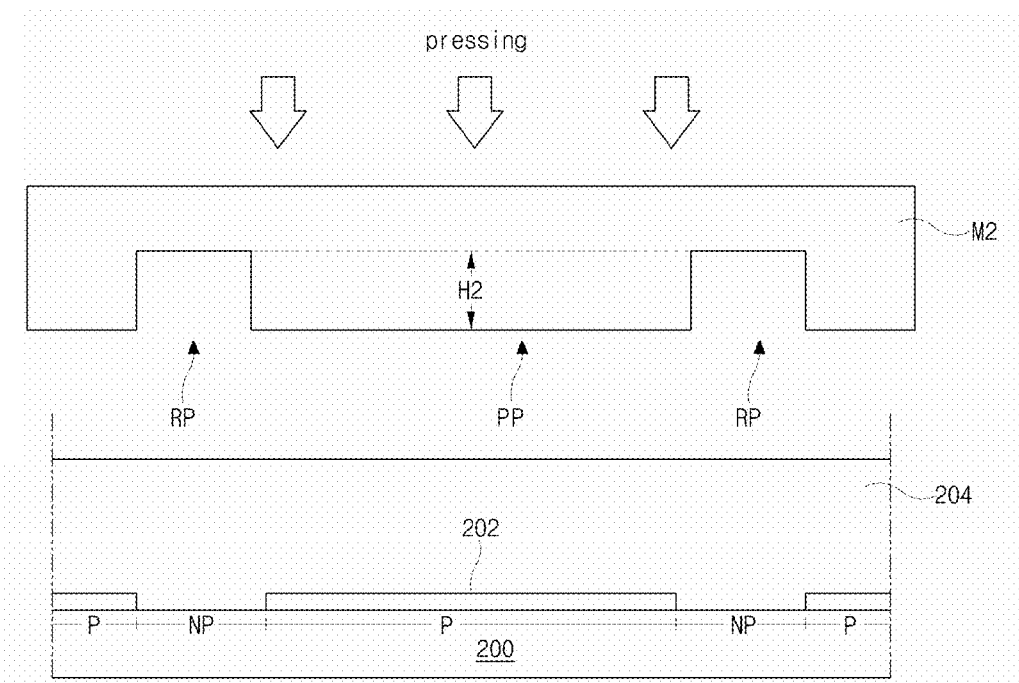
FIG. 8B is a cross-sectional view of the molding of a resin layer on a substrate in a process of fabricating an organic electroluminescent device according to the second embodiment of the present invention.

FIG. 8B is a cross-sectional view of the molding of a resin layer on a substrate in a process of fabricating an organic electroluminescent device according to the second embodiment of the present invention. Referring to FIG. 8B, a mold M2 is prepared. The mold M2 has a recessed portion RP alternating with a protruding portion PP. The recessed portion RP has the same height H2 as the protruding portion PP. The recessed portion RP and the protruding portion PP may each have a square shape. The mold M2 is slightly pressed on the resin solution layer 204.

When the mold M2 is slightly pressed against the resin solution layer 204, a portion of the resin solution layer 204 contacting the protruding portion PP of the mold M2 is moved toward the recessed portion RP due to a repulsion between the mold M2 and the resin solution layer 204. Thus, the portion of the resin solution layer 204 contacting the protruding portion PP of the mold M2 fills the inner part of the recessed portion RP of the mold M2. Then, the resin solution layer 204 is solidified by heating it. Heating may be performed at two different temperatures including a first temperature smaller than or equal to a boiling point of the resin solution of the resin solution layer 204, and a second temperature higher than the first temperature.

Figure 8C:
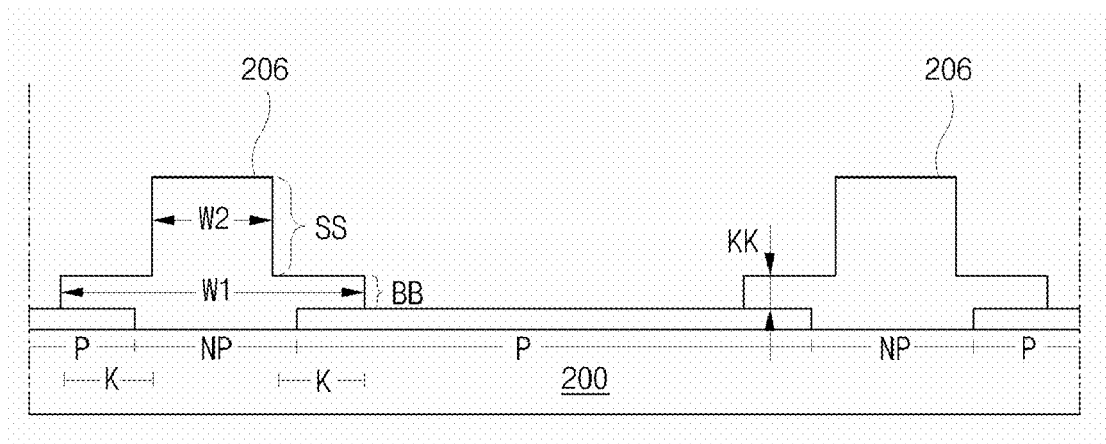
FIG. 8C is a cross-sectional view of the formation of a separator on a substrate in a process of fabricating an organic electroluminescent device according to the second embodiment of the present invention.

FIG. 8C is a cross-sectional view of the formation of a separator on a substrate in a process of fabricating an organic electroluminescent device according to the second embodiment of the present invention. Referring to FIG. 8C, the mold M2 (shown in FIG. 8B) is removed, leaving the solidified molded resin solution layer on the substrate 200. The solidified molded resin solution layer forms a separator 206 on the substrate 200. The separator 206 has a first portion BB having the first width W1 and a second portion SS having the second width W2. The first portion BB of the separator 206 overlaps edges of the first electrode 202. The second portion SS of the separator 206 is located within the non-pixel region P.

The first portion BB acts as a buffer layer and the second portion SS acts as a substantial separator means. The first width W1 of the first portion BB is larger than the second width W2 of the second portion SS. A side gap K between the first width W1 and the second width W2 is between 2 micrometers and 10 micrometers, a thickness KK of the first portion BB of the separator 206 is less than about 300 nanometers.

Figure 8D:
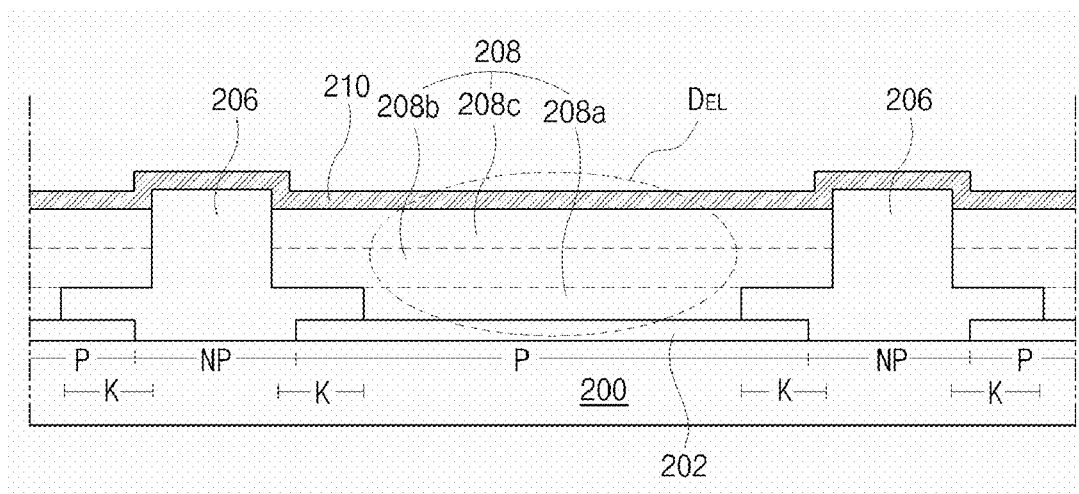
FIG. 8D is across-sectional view of the formation of an organic electroluminescent layer on a substrate in a process of fabricating an organic electroluminescent device according to the second embodiment of the present invention.

FIG. 8D is a cross-sectional view of the formation of an organic electroluminescent layer on a substrate in a process of fabricating an organic electroluminescent device according to the second embodiment of the present invention. Referring to FIG. 8D, at least one organic electroluminescent (EL) layer 208 is formed on the first electrode 202 in the pixel region P surrounded by the separator 206. Forming the organic EL layer 208 includes forming red, green and blue EL layers (not shown) in the pixel regions P in repeating order. The at least one organic EL layer 208 may be a single layer or may include multiple layers. When the at least one organic EL layer 208 includes multiple layers and the first electrode 202 acts as the anode, the at least one organic EL layer 208 includes a hole transporting layer 208a on the first electrode 202, an emitting layer 208b and an electron transporting layer 208c on a later-formed second electrode.

A second electrode 210 is formed on the entire surface of the organic EL layer 208 and the separator 206. When the second electrode 210 acts as a cathode, it includes a metallic material, such as calcium (Ca), aluminum (Al) and magnesium (Mg) and lithium fluorine/aluminum (LiF/Al). The first electrode 202, the organic EL layer 208 and the second electrode 210 form an organic EL diode $D_{EL}$. Although not shown, an array element layer including a gate line, a data line, a power line and a thin film transistor may be formed between the substrate 200 and the organic EL diode $D_{EL}$.

Hereinafter, a dual-panel type OELD device will be described, in which an array element layer and an organic EL diode are formed on their respective substrates. A method of fabricating a dual-panel type OELD device will also be described, which can reduce processing time and cost by providing a separator that functions as a buffer.

Figure 9:
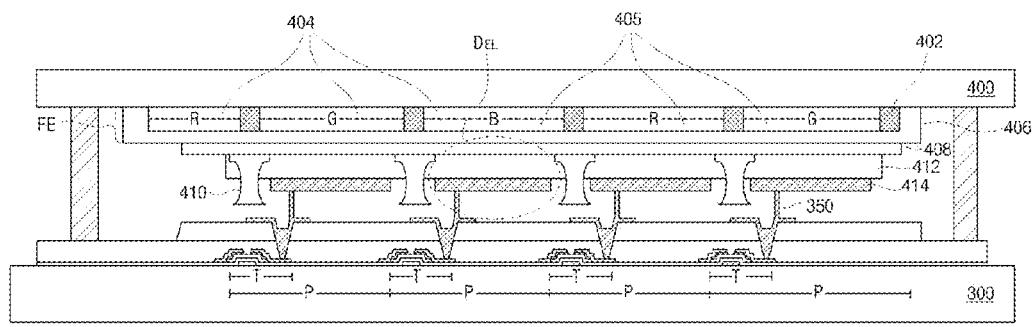
FIG. 9 is a cross-sectional view of an exemplary dual-panel type organic electroluminescent device according to a third embodiment of the present invention.

FIG. 9 is a cross-sectional view of an exemplary dual-panel type organic electroluminescent device according to a third embodiment of the present invention. Referring to FIG. 9, first and second substrates 300 and 400 including a plurality of pixel regions P face each other and are spaced apart from each other. A full-color element layer FE is formed on the second substrate 400. Specifically, the full-color element layer FE includes a color filter layer 404 on the second substrate 400 in the pixel region P, a color changing medium 405 on the color filter layer 404, a black matrix 402 on the second substrate 400 at a boundary of the color filter layer 404 and the color changing medium 405, and an overcoat layer 406 covering the entire surface of the black matrix 402, the color changing medium 405 and the color filter layer 404. The color filter layer 404 includes red, green and blue sub-color filters (not shown). The color changing medium 405 includes red, green and blue color changing media (not shown) corresponding to the red, green and blue sub-color filters, respectively. The overcoat layer 406 may include an organic insulating material, such as benzocyclobutene (BCB), polyacrylate, polyimide and polyamide.

A first electrode 408 is formed on the overcoat layer 406. A separator 410 is formed over the first electrode 408 at the boundary of the pixel region P. An organic EL layer 412 and a second electrode 414 are formed on the first electrode 408 in the pixel region P surrounded by the separator 410. When the first electrode 408 acts as an anode and the second electrode 414 acts as a cathode, the first electrode 408 may include a conductive material, such as indium tin oxide (ITO), and the second electrode 414 may include a metallic material, such as calcium (Ca), aluminum (Al) and magnesium (Mg), and lithium fluorine/aluminum (F/Al). The first electrode 408, the organic EL layer 412 and the second electrode 414 form an organic EL diode $D_{EL}$.

Figure 10A:
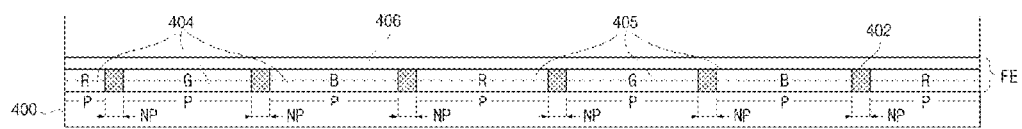
FIG. 10A is a cross-sectional view of the formation of a full-color element layer on a substrate in a process of fabricating an organic electroluminescent diode substrate for a dual-panel type organic electroluminescent device according to the third embodiment of the present invention.

FIG. 10A is a cross-sectional view of the formation of a full-color element layer on a substrate in a process of fabricating an organic electroluminescent diode substrate for a dual-panel type organic electroluminescent device according to the third embodiment of the present invention. Referring to FIG. 10A, a second substrate 400 includes a pixel region P, and a non-pixel region NP at a boundary of the pixel region P. A full-color element layer FE is formed on the second substrate 400. The full-color element layer FE includes a black matrix 402, a color filter layer 404 and a color changing medium 405. The black matrix 402 is located in the non-pixel region NP and includes one of a black resin and a chrome based material. An overcoat layer 406 is formed on the entire surface of the full-color element layer FE.

Figure 10B:
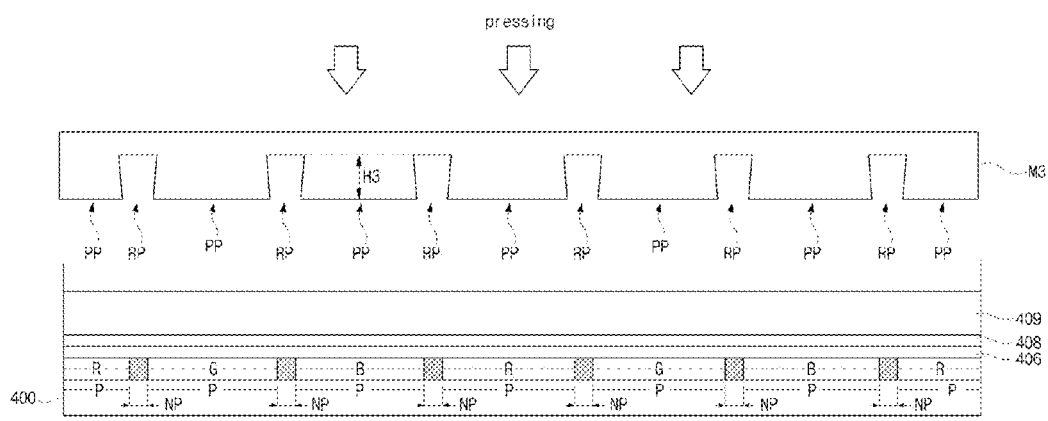
FIG. 10B is a cross-sectional view of the molding of a resin layer on an electrode in a process of fabricating an organic electroluminescent diode substrate for a dual-panel type organic electroluminescent device according to the third embodiment of the present invention.

FIG. 10B is a cross-sectional view of the molding of a resin layer on an electrode in a process of fabricating an organic electroluminescent diode substrate for a dual-panel type organic electroluminescent device according to the third embodiment of the present invention. Referring to FIG. 10B, a first electrode 408 is formed on the entire surface of the overcoat layer 406. When the first electrode 408 acts as an anode, it includes a conductive material having a high work-function such as indium tin oxide (ITO).

A resin solution is coated on the entire surface of the first electrode 408 to form a resin solution layer 409. The resin solution layer 409 may include a transparent organic insulating material, such as acrylic resin. Then, a mold M3 is pressed on the resin solution layer 409 according to a predetermined pressure. The mold M3 includes a recessed portion RP alternating with a protruding portion PP. The recessed portion RP has the same height H3 as the protruding portion PP. As shown in FIG. 10B, when the recessed portion RP and the protruding portion PP of the mold M3 face the resin solution layer 409, the width of the recessed portion RP gradually decreases toward the second substrate 400 and the width of the protruding portion PP gradually increases toward the second substrate 400.

The resin solution layer 409 is solidified by heating under a predetermined pressure. The heating process may be performed at a temperature higher than a boiling point and a transition temperature of the resin solution layer 409. For example, the predetermined pressure may be within 1 N/cm$^2$ to 100 N/cm$^2$. The pressing process is similar to the one described in reference to FIG. 7B.

Figure 10C:
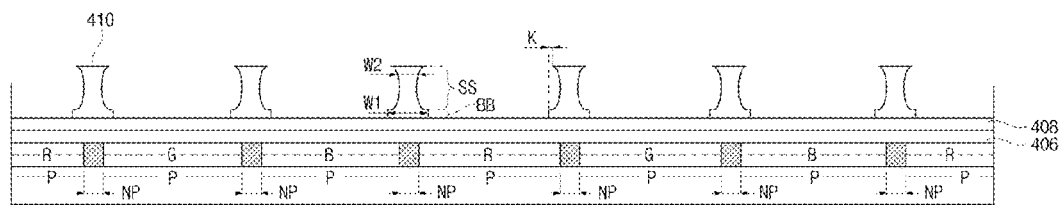
FIG. 10C is a cross-sectional view of the formation of a separator on an electrode in a process of fabricating an organic electroluminescent diode substrate for a dual-panel type organic electroluminescent device according to the third embodiment of the present invention.

FIG. 10C is a cross-sectional view of the formation of a separator on an electrode in a process of fabricating an organic electroluminescent diode substrate for a dual-panel type organic electroluminescent device according to the third embodiment of the present invention. Referring to FIG. 10C, the mold M3 (shown in FIG. 10B) is removed from the second substrate 400 leaving a solidified resin solution layer on the first electrode 408. The solidified resin solution layer on the first electrode 408 forms a separator 410 on the first electrode 408 in the non-pixel region NP.

The separator 410 has a first portion BB and a second portion SS. The first portion BB is closer to the second substrate 400 than the second portion SS. A first width W1 of the first portion BB is larger that a second width W2 of the second portion SS. A cross-sectional of the second portion SS decreases gradually from both end sides toward a middle part of the cross-sectional. A side gap K of a top side of the second portion SS and a bottom side of the first portion BB may be about 2 micrometers.

Figure 10D:
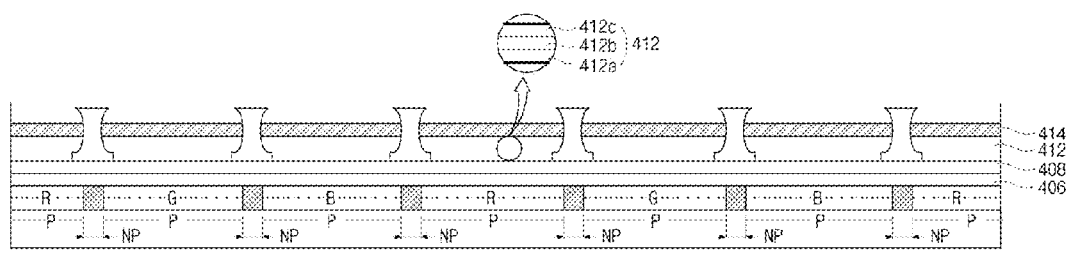
FIG. 10D is a cross-sectional view of the formation of an organic electroluminescent layer on an electrode in a process of fabricating an organic electroluminescent diode substrate for a dual-panel type organic electroluminescent device according to the third embodiment of the present invention.

FIG. 10D is a cross-sectional view of the formation of an organic electroluminescent layer on an electrode in a process of fabricating an organic electroluminescent diode substrate for a dual-panel type organic electroluminescent device according to the third embodiment of the present invention. Referring to FIG. 10D, at least one organic EL layer 412 and a second electrode 414 are sequentially formed on the first electrode 408 in the pixel region P surrounded by the separator 410. The organic EL layer 412 includes red, green and blue EL layers (not shown) in the pixel regions P in repeating order.

The at least one organic EL layer 412 may include a single layer or multiple layers. When the at least one organic EL layer 412 includes multiple layers and the first electrode 414 acts as the anode, the at least one organic EL layer 412 includes a hole transporting layer 412a on the first electrode 414, an emitting layer 412b and an electron transporting layer 412c. When the second electrode 414 acts as a cathode, it may include a metallic material, such as calcium (Ca), aluminum (Al) and magnesium (Mg) and lithium fluorine/aluminum (LiF/Al).

Figure 11:
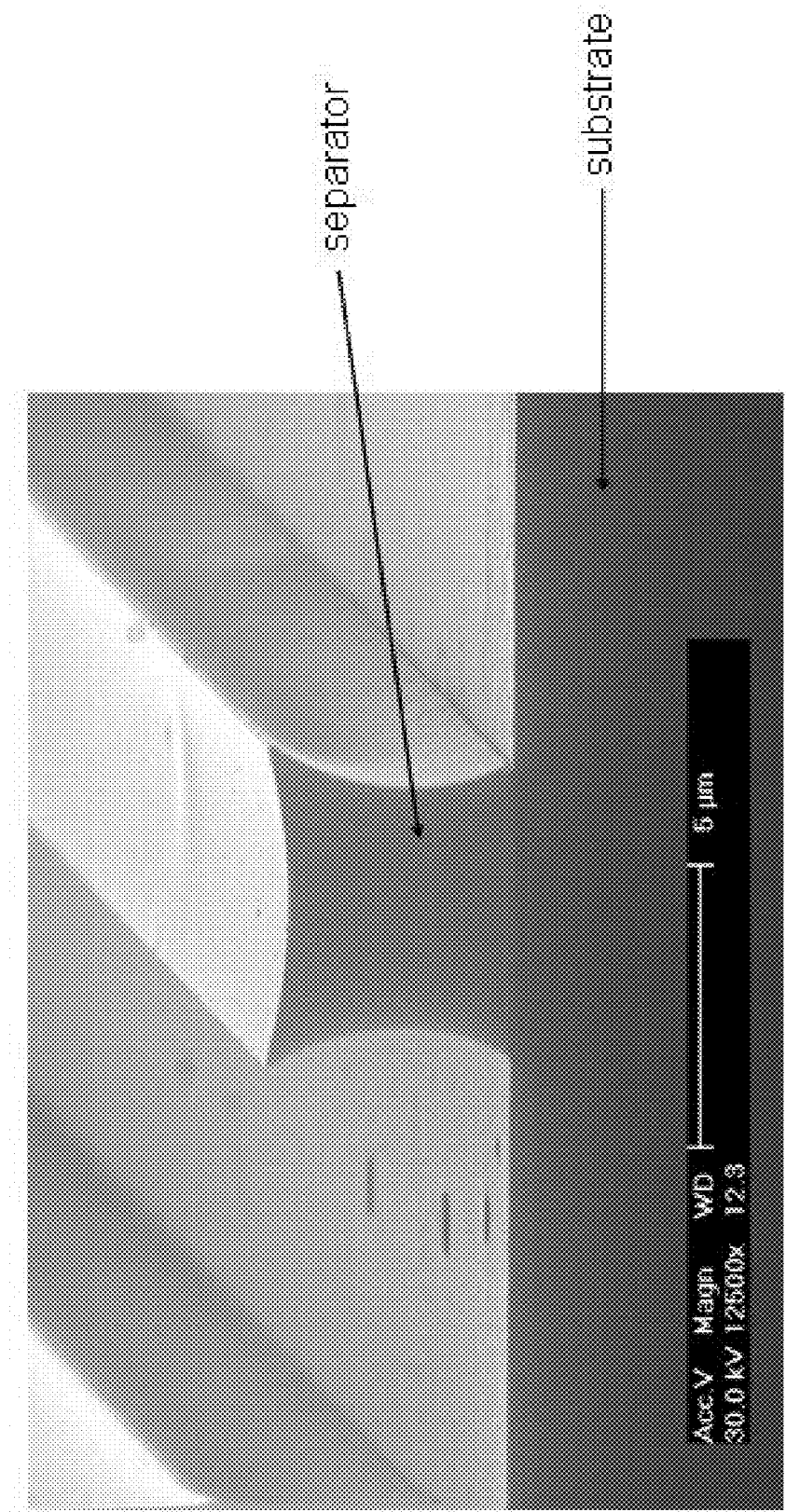
FIG. 11 is a scanning electron microscopic view of an exemplary separator manufactured in accordance with the third embodiment of the present invention.

FIG. 11 is a scanning electron microscopic view of an exemplary separator manufactured in accordance with the third embodiment of the present invention. Referring to FIG. 11, the separator includes a novolac solution dissolved in ethanol at a concentration of 15% in weight. The resin solution layer is pressed under a pressure of about 10 N/cm$^2$ and heating is performed at about 130 degrees Celsius while the resin solution layer is pressed by the mold. Moreover, the first width of the first portion is about 5 micrometers.

Figure 12A:
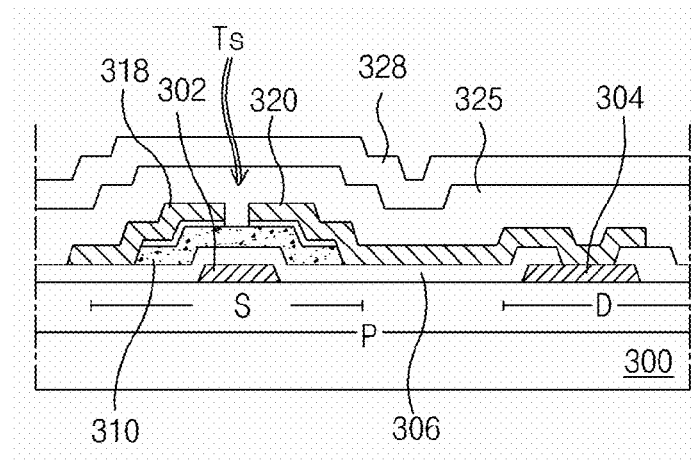
FIGS. 12A and 12B are cross-sectional views of an array substrate for a dual-panel type organic electroluminescent device according to an embodiment of the present invention.
Figure 12B:
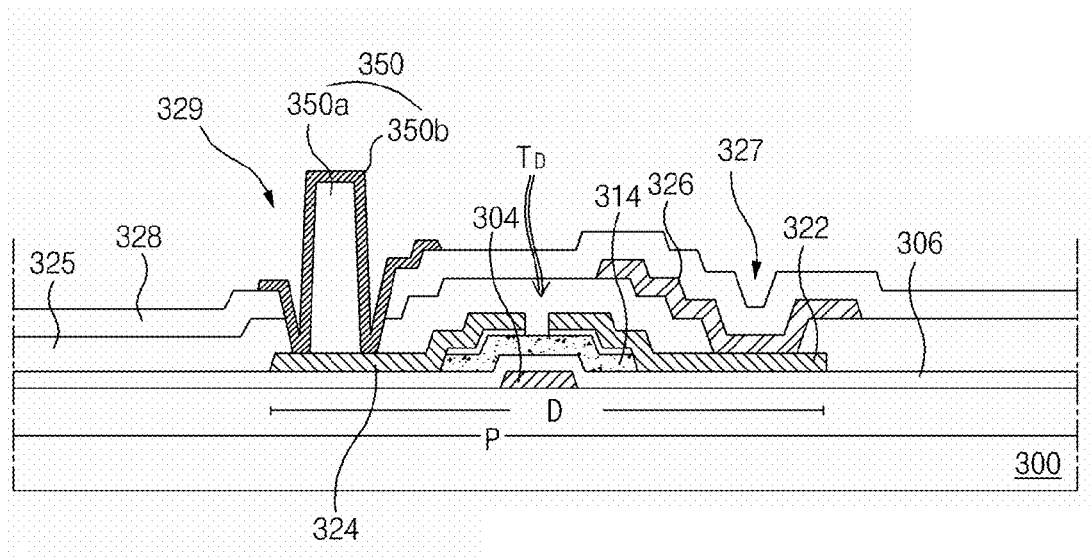

FIGS. 12A and 12B are cross-sectional views of an array substrate for a dual-panel type organic electroluminescent device according to an embodiment of the present invention. Hereinafter, a method of fabricating an array substrate for a dual-panel type OELD device will be described in reference to FIGS. 12A and 12B. Referring to FIGS. 12A and 12B, a pixel region P on a first substrate 300 includes a switching region S and a driving region D. A switching thin film transistor $T_S$ and a driving thin film transistor $T_D$ are formed on the first substrate 300 including the switching region S and the driving region D, respectively. The switching thin film transistor $T_S$ includes a switching gate electrode 302, a switching active layer 310, a switching source electrode 318, and a switching drain electrode 320. Similarly, the driving thin film transistor $T_D$ includes a driving gate electrode 304, a driving active layer 314, a driving source electrode 322, and a driving drain electrode 324.

The switching gate electrode 302 is connected to a gate line (not shown). The switching source electrode 318 is connected to a data line (not shown). The switching drain electrode 320 is connected to the driving gate electrode 304. The driving source electrode 322 is connected to a power line 326. A gate insulating layer 306 is formed between the gate electrodes 302 and 304 and the active layers 310 and 314.

A first passivation layer 325 is formed between the switching thin film transistor Ts and the power line 326. A first contact hole 327 is provided through the first passivation layer 325. The first contact hole 327 exposes a portion of the driving source electrode 322. The power line 326 is connected to the driving source electrode 322 via the first contact hole 327.

A second passivation layer 328 is formed on the entire surface of the power line 326 and the switching thin film transistor Ts. A second contact hole 329 is provided through the first passivation layer 325 and the second passivation layers 328. The second contact hole 329 exposes a portion of the driving electrode 324.

A connection electrode 350 is formed on the second passivation layer 328. The connection electrode 350 is connected to the driving drain electrode 324 via the second contact hole 329. The connection electrode 350 includes an organic pattern 350a having a predetermined height and a metallic material layer 350b covering the organic pattern 350a. Although not shown, the connection electrode 350 electrically connects the organic EL Diode and the array element layer by attaching the first and second substrates 300 and 400. For example, the connection electrode 350 connects the second electrode 400 and the driving thin film transistor $T_D$.

In accordance with embodiments of the present invention, the OELD device may have a high aperture ratio because the OELD device is a top emission type. Undesired effects due to the fabricating process of the organic EL diode can be prevented because the array layers are independently formed on respective substrates. Accordingly, overall production yield increases. A separate buffer layer is not required because the OELD device includes a separator, a second portion of which functions as a buffer layer. The molding of the separator can be performed without any mask process, thereby reducing processing time and cost.

It will be apparent to those skilled in the art that various modifications and variations can be made in the organic electroluminescent display device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
   a first substrate, including a pixel region and a non-pixel region at a boundary of the pixel region;
   a first electrode on an entire surface of the first substrate;
   a separator over the first electrode in the non-pixel region, the separator having a first portion having a first width and a second portion having a second width smaller than the first width, a cross-sectional of the second portion decreasing gradually from both end sides thereof toward a middle part thereof, wherein the second width decreases along a direction from top and bottom portions to a middle portion between the top and bottom portions, the second portion is on the first portion, and the first portion is between the second portion and the first electrode wherein the first and second sortions are formed of the same material as a single body;
   an organic electroluminescent layer over the separator, the organic electroluminescent layer in the pixel region; and
   a second electrode on the organic electroluminescent layer, the second electrode corresponding to the organic electroluminescent layer.

2. The device according to claim 1, wherein a side gap of a top side of the second portion and a bottom side of the first portion is about 2 micrometers.

3. The device according to claim 1, wherein the first electrode, the organic electroluminescent layer and the second electrode form an organic electroluminescent diode.

4. The device according to claim 3, comprising an array element layer including a switching thin film transistor and a driving thin film transistor connected to the switching thin film transistor on a second substrate facing and spaced apart from the first substrate, and a connection electrode connecting the array element layer and the organic electroluminescent diode between the array element layer and the organic electroluminescent diode.

5. The device according to claim 4, wherein the array element layer further includes a gate line, a data line crossing the gate line and a power line crossing one of the gate line and the data line, the gate line and the data line connected to the switching thin film transistor, and the power line connected to the driving thin film transistor.

6. The device according to claim 1, wherein the first electrode acts as an anode.

7. The device according to claim 6, wherein the first electrode includes indium tin oxide (ITO).

8. The device according to claim 6, wherein the organic electroluminescent layer includes a hole transporting layer on the first electrode.

9. The device according to claim 1, wherein the second electrode acts as a cathode.

10. The device according to claim 9, wherein the second electrode includes one of calcium (Ca), aluminum (Al) and magnesium (Mg) and lithium fluorine/aluminum (LiF/Al).

11. The device according to claim 9, wherein the organic electroluminescent layer includes an electron transporting layer on the second electrode.

* * * * *